United States Patent
Singleton et al.

(10) Patent No.: US 9,442,171 B2
(45) Date of Patent: Sep. 13, 2016

(54) MAGNETIC SENSING DEVICE WITH REDUCED SHIELD-TO-SHIELD SPACING

(75) Inventors: Eric W. Singleton, Maple Plain, MN (US); Qing He, Plymouth, MN (US); Jae-Young Yi, Shakopee, MN (US); Matt Johnson, Edina, MN (US); Zheng Gao, Savage, MN (US); Dimitar V. Dimitrov, Edina, MN (US); Song S. Xue, Edina, MN (US)

(73) Assignee: SEAGATE TECHNOLOGY LLC, Scotts Valley, CA (US)

( * ) Notice: Subject to any disclaimer, the term of this patent is extended or adjusted under 35 U.S.C. 154(b) by 2000 days.

(21) Appl. No.: 11/971,664

(22) Filed: Jan. 9, 2008

(65) Prior Publication Data

US 2009/0174968 A1 Jul. 9, 2009

(51) Int. Cl.
G11B 5/39 (2006.01)
G01R 33/09 (2006.01)
B82Y 25/00 (2011.01)

(52) U.S. Cl.
CPC ............. G01R 33/093 (2013.01); G11B 5/398 (2013.01); G11B 5/3912 (2013.01); B82Y 25/00 (2013.01)

(58) Field of Classification Search
CPC .. G01R 33/093; G11B 5/3912; G11B 5/398; B82Y 25/00
USPC .................................. 360/324.2, 324.1, 319
See application file for complete search history.

(56) References Cited

U.S. PATENT DOCUMENTS

| | | | |
|---|---|---|---|
| 5,559,654 A * | 9/1996 | Das ......................... | 360/125.62 |
| 5,644,456 A | 7/1997 | Smith et al. | |
| 5,754,376 A * | 5/1998 | Kobayashi et al. ..... | 360/327.31 |
| 5,913,550 A * | 6/1999 | Watanuki ..................... | 29/603.1 |
| 5,932,396 A * | 8/1999 | Kamijima ..................... | 430/320 |
| 5,969,896 A * | 10/1999 | Nakamoto et al. ............. | 360/66 |
| 6,208,491 B1 | 3/2001 | Pinarbasi | |
| 6,275,363 B1 * | 8/2001 | Gill ........................... | 360/324.2 |
| 6,344,955 B1 * | 2/2002 | Sato et al. ............... | 360/327.32 |
| 6,700,759 B1 * | 3/2004 | Knapp et al. ............... | 360/324.2 |
| 6,700,760 B1 | 3/2004 | Mao | |
| 6,806,804 B2 | 10/2004 | Saito et al. | |
| 7,183,893 B2 | 2/2007 | Clifton et al. | |
| 7,238,979 B2 | 7/2007 | Horng et al. | |
| 7,248,449 B1 * | 7/2007 | Seagle ........................ | 360/324.2 |
| 7,449,345 B2 * | 11/2008 | Horng et al. ..................... | 438/3 |
| 2002/0023338 A1 | 2/2002 | Seigler et al. | |
| 2002/0024780 A1 | 2/2002 | Mao et al. | |
| 2002/0196588 A1 | 12/2002 | Gill | |

(Continued)

OTHER PUBLICATIONS

"NiFeCr Magnetic Material", IBM Technical Disclosure Bulletin, Apr. 1978.*

(Continued)

*Primary Examiner* — Julie Anne Watko
(74) *Attorney, Agent, or Firm* — Faegre Baker Daniels LLP (57) ABSTRACT

A magnetic sensor assembly includes first and second shields each comprised of a magnetic material. The first and second shields define a physical shield-to-shield spacing. A sensor stack is disposed between the first and second shields and includes a seed layer adjacent the first shield, a cap layer adjacent the second shield, and a magnetic sensor between the seed layer and the cap layer. At least a portion of the seed layer and/or the cap layer comprises a magnetic material to provide an effective shield-to-shield spacing of the magnetic sensor assembly that is less than the physical shield-to-shield spacing.

16 Claims, 5 Drawing Sheets (56) References Cited

U.S. PATENT DOCUMENTS

| | | |
|---|---|---|
| 2003/0030945 A1 | 2/2003 | Heinonen et al. |
| 2003/0103299 A1 | 6/2003 | Saito |
| 2003/0128483 A1 | 7/2003 | Kamijo |
| 2003/0227725 A1 | 12/2003 | Macken et al. |
| 2005/0167770 A1 | 8/2005 | Fukuzawa et al. |
| 2005/0248980 A1 | 11/2005 | Han et al. |
| 2006/0007605 A1 | 1/2006 | Li et al. |
| 2006/0132983 A1 | 6/2006 | Osugi et al. |
| 2006/0154573 A1 | 7/2006 | Feng et al. |
| 2006/0164765 A1 | 7/2006 | Li et al. |
| 2007/0139827 A1 | 6/2007 | Gao et al. |
| 2008/0080093 A1* | 4/2008 | Inamura et al. ......... 360/125.73 |
| 2008/0124579 A1* | 5/2008 | Kaitsu et al. ................. 428/800 |
| 2011/0007427 A1* | 1/2011 | Qiu et al. ...................... 360/319 |
| 2012/0268846 A1* | 10/2012 | Gadbois et al. .............. 360/319 |

OTHER PUBLICATIONS

H. Katada et al., Soft Magnetic Properties and Microstructure of NiFe(Cr)/FeCo/NiFe(Cr) Films with Large Saturation Magnetization, IEEE Transactions on Magnetics, 2225-27, vol. 38, No. 5 (Sep. 2002).

* cited by examiner

MAGNETIC SENSING DEVICE WITH REDUCED SHIELD-TO-SHIELD SPACING

BACKGROUND

In an electronic data storage and retrieval system, a magnetic recording head typically includes a reader portion having a sensor for retrieving magnetically encoded information stored on a magnetic disc. Magnetic flux from the surface of the disc causes rotation of the magnetization vector of a sensing layer or layers of the sensor, which in turn causes a change in the electrical properties of the sensor. The sensing layers are often called free layers, since the magnetization vectors of the sensing layers are free to rotate in response to external magnetic flux. The change in the electrical properties of the sensor may be detected by passing a current through the sensor and measuring a voltage across the sensor. Depending on the geometry of the device, the sense current may be passed in the plane (CIP) of the layers of the device or perpendicular to the plane (CPP) of the layers of the device. External circuitry then converts the voltage information into an appropriate format and manipulates that information as necessary to recover information encoded on the disc.

Contemporary read heads typically include a thin film multilayer structure containing ferromagnetic material that exhibits some type of magnetoresistance (MR). A typical MR sensor configuration includes a multilayered structure formed of a nonmagnetic layer positioned between a synthetic antiferromagnet (SAF) and a ferromagnetic free layer, or between two ferromagnetic free layers. The resistance of the MR sensor depends on the relative orientations of the magnetization of the magnetic layers.

An MR sensor may include shields consisting of high permeability materials that function to protect the sensor from stray magnetic fields originating from adjacent magnetic bits on the medium. With decreasing sensor size, the shield-to-shield spacing of the MR sensor should be made smaller to adequately screen the flux from adjacent bits. However, the seed and cap layers of the magnetic sensor occupy a large proportion of the total stack thickness and provide a limit to the reduction of the shield-to-shield spacing for magnetic sensors.

SUMMARY

The present invention relates to a magnetic sensor including first and second shields each comprised of a magnetic material. The first and second shields define a physical shield-to-shield spacing. A sensor stack is disposed between the first and second shields and includes a seed layer adjacent the first shield, a cap layer adjacent the second shield, and a magnetically sensitive portion between the seed layer and the cap layer. At least a portion of the seed layer and/or the cap layer comprises a magnetic material to provide an effective shield-to-shield spacing of the magnetic sensor assembly that is less than the physical shield-to-shield spacing.

DETAILED DESCRIPTION

Figure 1:
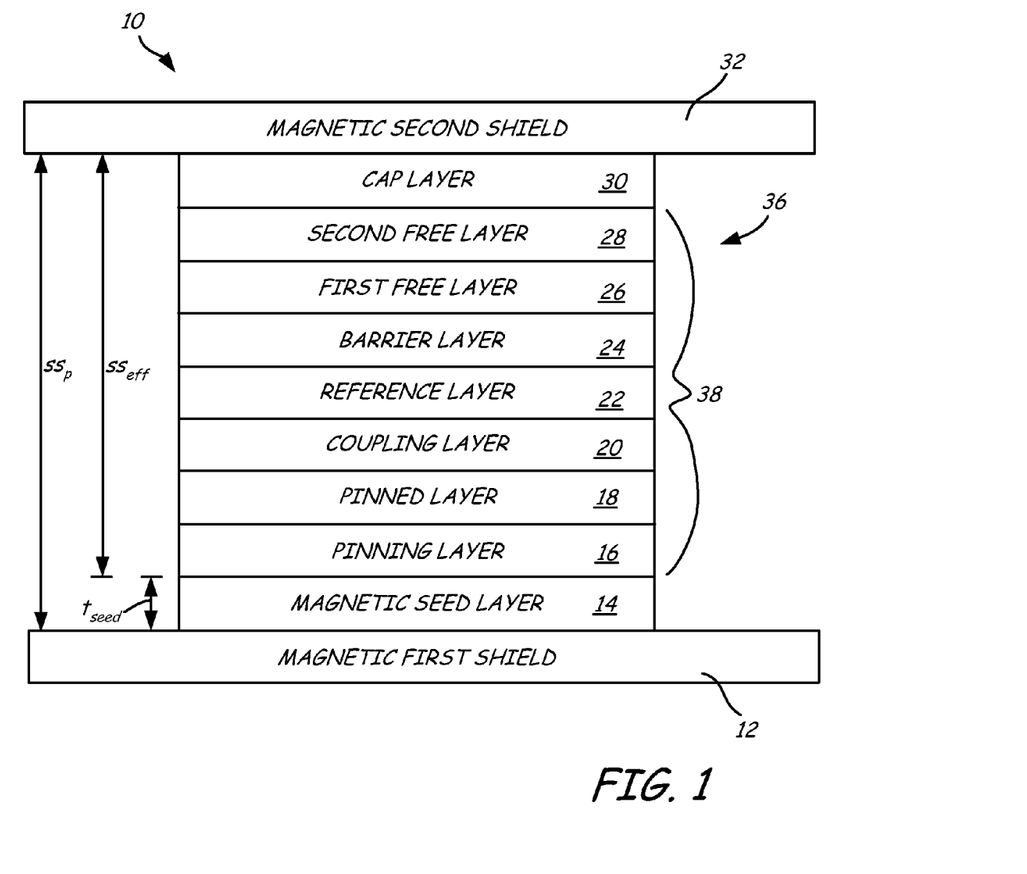
FIG. 1 is a layer diagram of a magnetic sensor assembly including magnetic first shield, seed, and second shield layers.

FIG. 1 is a layer diagram of magnetic sensor assembly 10 including first shield layer 12, seed layer 14, pinning layer 16, pinned layer 18, coupling layer 20, reference layer 22, barrier layer 24, first free layer 26, second free layer 28, cap layer 30, and second shield layer 32. First shield layer 12 and second shield layer 32 are made of a magnetic material, such as NiFe, NiFeCu, or NiCoFe. Sensor stack 36 includes seed layer 14, cap layer 30, and magnetic sensor 38. Magnetic sensor 38 includes pinning layer 16, pinned layer 18, coupling layer 20, reference layer 22, barrier layer 24, first free layer 26, and second free layer 28. Sensor stack 36 may be formed by depositing successive layers on first shield layer 12 or may be formed in a separate process and later incorporated between first shield layer 12 and second shield layer 32.

The magnetization of reference layer 22 is fixed while the magnetizations of free layers 26 and 28 rotate in response to an external magnetic field from a magnetic medium. Pinned layer 18 and reference layer 22 are magnetically coupled by coupling layer 20 and make up a synthetic antiferromagnet (SAF). The magnetization direction of pinned layer 18, which is opposite the magnetization direction of reference layer 22, is pinned by exchange coupling pinning layer 16 with pinned layer 18. Seed layer 14 enhances the grain growth of pinning layer 18 and cap layer 30 adds a protective layer to the top of magnetic sensor 18. First shield 12 and second shield 32 protect magnetic sensor 38 from flux emanated from adjacent tracks on the magnetic medium.

Magnetic sensor assembly 10 produces a signal when a sense current is passed through the layers of sensor stack 36. In some embodiments, first shield 12 and second shield 32 deliver the sense current to sensor stack 36. The sense current experiences a resistance that is proportional to the angle between the magnetization direction of free layers 26 and 28 and the magnetization direction of reference layer 22.

While a magnetic sensor 38 is shown as a TMR sensor in FIG. 1, it will be appreciated that other sensor configurations are possible. For example, magnetic sensor 38 may alternatively be configured to exhibit a giant magnetoresistance (GMR) or other types of magnetoresistance. In addition, pinning layer 16, pinned layer 18, coupling layer 20, and reference layer 22 may alternatively be replaced by one or more free layers to provide a tri-layer type magnetic sensor.

Magnetic sensor assembly 10 has a physical shield-to-shield spacing $ss_p$. The linear density of magnetic sensor assembly 10 is strongly correlated to the shield-to-shield spacing of magnetic sensor assembly. Consequently, in order to increase the linear density (i.e., the number of magnetic transitions per unit length) of magnetic sensor assembly 10, the shield-to-shield spacing may be reduced from physical shield-to-shield spacing $ss_p$. One approach to accomplishing this is to form seed layer 14, which has a thickness $t_{seed}$, of a magnetic material. The material selected for seed layer 14 may have some or all of the following properties: magnetically soft, crystalline structure that matches the crystalline structure of first shield layer 12, adequate pinning field for pinned layer 18 of magnetic sensor 38, low electrical resistance, high corrosion resistance, and high bulk oxidation resistance. Alternatively, seed layer 14 may be made of an amorphous material. In some embodiments, seed layer 14 has a coercivity of less than about 2.0 Oe. In other embodiments, seed layer 14 has a coercivity of less than about 10 Oe. In further embodiments, seed layer 14 has a coercivity of more than about 10 Oe. In addition, the magnetostriction and/or magnetic anisotropy of the material may be considered in selecting the material for seed layer 14. In some embodiments, seed layer 14 is comprised of NiFe, NiFeNb, NiFeTa, NiFeRh, CoZrTa, CoZrNb, CoZrNd, CoFeB, CoFeTa, CoFeZr, CoFeRh, CoFe, CoCr, or $Ni_{>70\%}Cr_{<30\%}$. In the case of CoZrTa, the atomic percentage of each of Ta and Zr may be in the range of about 2% to about 10%. When seed layer 14 is made of a material having these properties, the shield-to-shield spacing of magnetic sensor assembly 10 is reduced from physical shield-to-shield spacing $ss_p$ by the thickness $t_{seed}$ of seed layer 14 to an effective shield-to-shield spacing $ss_{eff}$. In other words, effective shield-to-shield spacing $ss_{eff}$ is defined by the distance between magnetic layers most proximate to sensor stack 38 in magnetic sensor assembly 10. In some embodiments, seed layer 14 has a thickness $t_{seed}$ between about 10 Å and about 1,000 Å. In an alternative embodiment, the physical shield-to-shield spacing $ss_p$ may be reduced by eliminating seed layer 14 entirely.

Devices substantially similar to magnetic sensor assembly 10 were fabricated and tested to determine their resistance-area (RA) product of the devices and the magnetoresistive (MR) ratio. The MR ratio is the change in resistance exhibited by the device in response to changes in the sensed external field divided by the total resistance across the device. The devices fabricated included a 50 Å seed layer 14 comprising NiFe, a 70 Å pinning layer 16 comprising IrMn, an 18 Å pinned layer 18 comprising CoFeB, a 9 Å coupling layer 20 comprising Ru, an 20 Å reference layer 22 comprising CoFeB, an oxide barrier layer 24 having varying thicknesses, a 15 Å first free layer 26 comprising CoFe, a 30 Å second free layer 28 comprising NiFe, and a 175 Å cap layer 30 comprising Ta. The following table shows the ranges of RA product and MR ratio values and the median RA product and MR ratio measured for various thicknesses for barrier layer 24.

| Barrier Layer Thickess (Å) | RA Product Range ($\Omega$-$\mu m^2$) | Median RA Product ($\Omega$-$\mu m^2$) | MR Ratio Range (%) | Median MR Ratio (%) |
|---|---|---|---|---|
| 3.6 | 1.254-2.219 | 1.700 | 16.91-22.36 | 20.25 |
| 4.0 | 1.978-3.544 | 2.749 | 17.59-22.67 | 20.97 |
| 4.4 | 3.499-5.286 | 4.712 | 18.82-23.16 | 21.75 |
| 4.8 | 7.040-11.19 | 8.663 | 18.78-22.73 | 21.83 |

Figure 2:
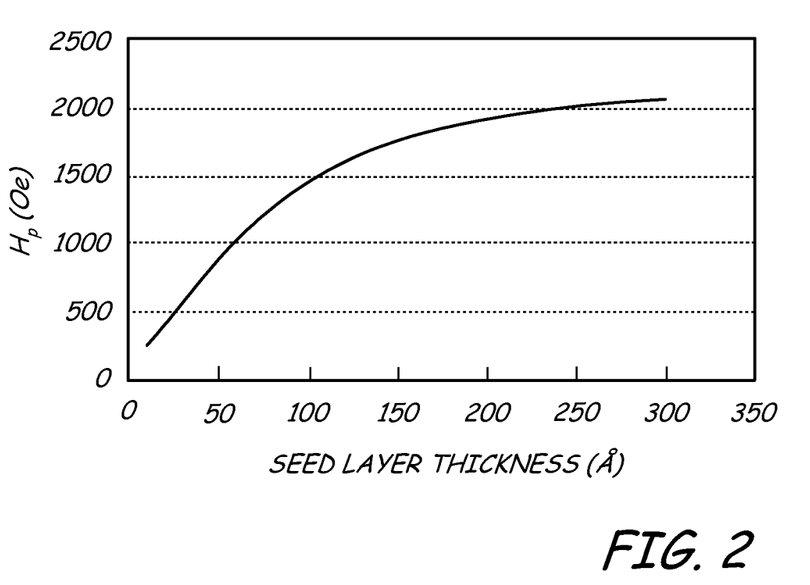
FIG. 2 is a graph showing the pinning field of the magnetic sensor assembly of FIG. 1 as a function of the thickness of the magnetic seed layer.

The magnetic stability of magnetic sensor 38 can also be improved by setting the thickness $t_{seed}$ of seed layer 14 to provide a large pinning field. FIG. 2 is a graph showing the pinning field $H_P$ as a function of thickness $t_{seed}$ of seed layer 14. As can be seen, as the thickness $t_{seed}$ of seed layer 14 is increased, the pinning field in magnetic sensor assembly 10 also increases. Since seed layer 14 made of a magnetic material does not affect the effective shield-to-shield spacing $ss_{eff}$ of magnetic sensor assembly 10, seed layer 14 can be made sufficiently thick to maximize the pinning field to provide increased device stability.

Figure 3:
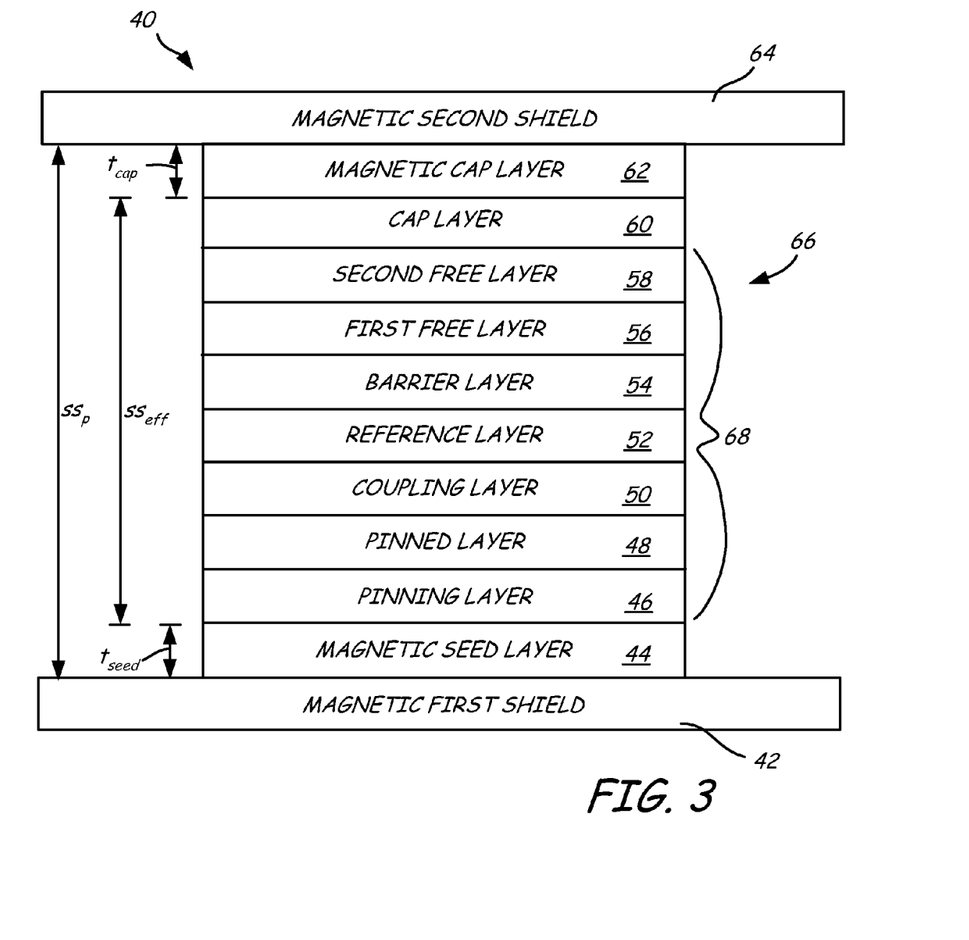
FIG. 3 is a layer diagram of a magnetic sensor assembly including magnetic first shield layer, a magnetic seed layer, partially magnetic cap bilayer, and a magnetic second shield layer.

Variations on the design shown in FIG. 1 may be made to adjust or further reduce the effective shield-to-shield spacing $ss_{eff}$ of the magnetic sensor assembly. For example, FIG. 3 is a layer diagram of a magnetic sensor assembly 40 including first shield layer 42, seed layer 44, pinning layer 46, pinned layer 48, coupling layer 50, reference layer 52, barrier layer 54, first free layer 56, second free layer 58, first cap layer 60, second cap layer 62, and second shield layer 64. First shield layer 42 and second shield layer 64 are made of a magnetic material, such as NiFe, NiFeCu, or NiCoFe. Sensor stack 66 includes seed layer 44, pinning layer 46, pinned layer 48, coupling layer 50, reference layer 52, barrier layer 54, first free layer 56, second free layer 58, first cap layer 60, and second cap layer 62. Magnetic sensor 68 includes pinning layer 46, pinned layer 48, coupling layer 50, reference layer 52, barrier layer 54, first free layer 56, and second free layer 58. Sensor stack 66 may be formed by depositing successive layers on first shield layer 42 or may be formed in a separate process and later incorporated between first shield layer 42 and second shield layer 64.

The operation of magnetic sensor assembly 40 is substantially similar to the operation of magnetic sensor assembly 10 as described with regard to FIG. 1. In this embodiment, seed layer 44 is again made of a magnetic material, and the cap assembly is a bilayer structure including first cap layer 60 made of a conventional capping material (e.g., Ta) and second cap layer 62 made of a magnetic material. The magnetic material selected for seed layer 44 and second cap layer 62 may have some or all of the following properties: magnetically soft, crystalline structure that matches the crystalline structure of the adjacent shield layer and/or pinning layer 46 (to promote crystalline texture, for example), adequate pinning field for pinned layer 48 of magnetic sensor 68, low electrical resistance, high corrosion resistance, and high bulk oxidation resistance. Alternatively, seed layer 44 and/or second cap layer 62 may be made of an amorphous material (to break texture between adjacent layers, for example). In some embodiments, seed layer 44 has a coercivity of less than about 2.0 Oe. In other embodiments, seed layer 44 has a coercivity of less than about 10 Oe. In further embodiments, seed layer 44 has a coercivity of more than about 10 Oe. In addition, the magnetostriction and/or magnetic anisotropy of the material may be considered in selecting the material for seed layer 44 and second cap layer 62. In some embodiments, seed layer 44 and second cap layer 62 are comprised of NiFe, NiFeNb, NiFeTa, NiFeRh, CoZrTa, CoZrNb, CoZrNd, CoFeB, CoFeTa, CoFeZr, CoFeRh, CoFe, CoCr, or $Ni_{>70\%}Cr_{<30\%}$. When seed layer 44 and second cap layer 62 are each made of a material having these properties, the shield-to-shield spacing of magnetic sensor assembly 40 is reduced from physical shield-to-shield spacing $ss_p$ by the thickness $t_{seed}$ of seed layer 44 and the thickness of $t_{cap}$ of second cap layer 62 to an effective shield-to-shield spacing $ss_{eff}$. In other words, effective shield-to-shield spacing $ss_{eff}$ is defined by the distance between magnetic layers most proximate to sensor stack 68 in magnetic sensor assembly 40. In some embodiments, seed layer 44 and second cap layer 62 each has a thickness $t_{seed}$ between about 10 Å and about 1,000 Å. In an alternative embodiment, a single magnetic cap layer is formed on magnetic sensor 68 instead of the bilayer cap assembly shown.

Figure 4:
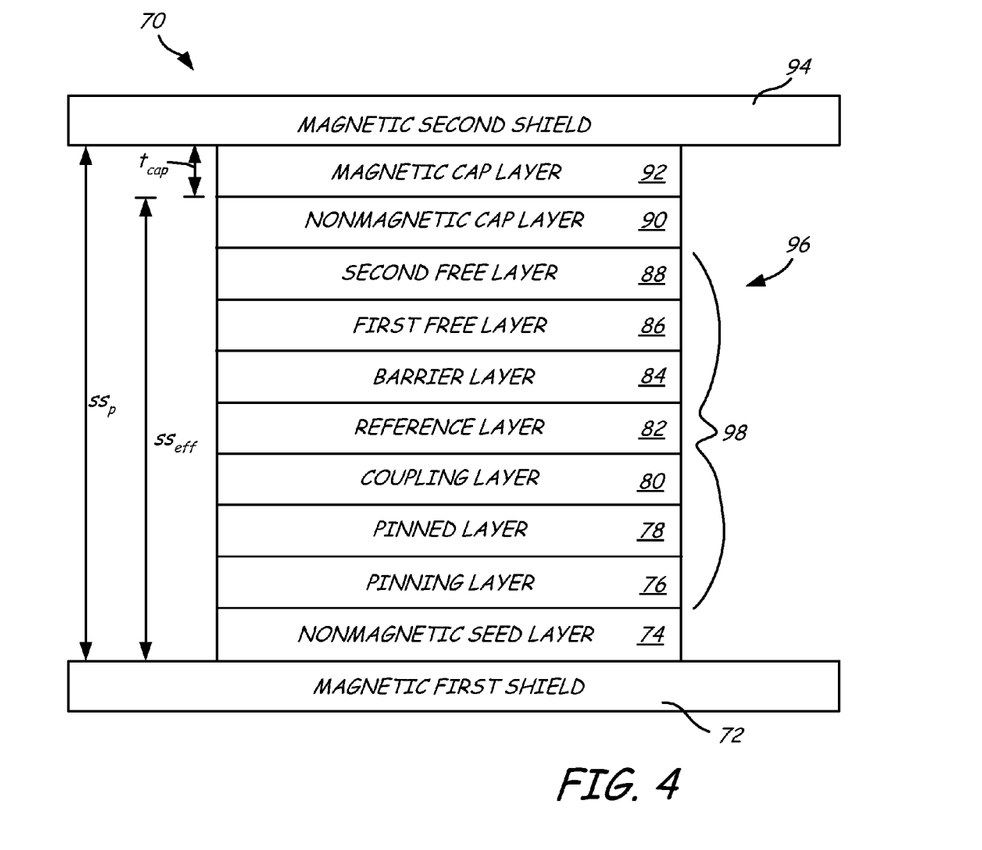
FIG. 4 is a layer diagram of a magnetic sensor assembly including magnetic first shield layer, a nonmagnetic seed layer, a magnetic cap layer, and a magnetic second shield layer.

FIG. 4 is a layer diagram of magnetic sensor assembly 70 including first shield layer 72, seed layer 74, pinning layer 76, pinned layer 78, coupling layer 80, reference layer 82, barrier layer 84, first free layer 86, second free layer 88, nonmagnetic cap layer 90, magnetic cap layer 92, and second shield layer 94. First shield layer 72 and second shield layer 94 are made of a magnetic material, such as NiFe, NiFeCu, or NiCoFe. Sensor stack 96 includes seed layer 74, pinning layer 76, pinned layer 78, coupling layer 80, reference layer 82, barrier layer 84, first free layer 86, second free layer 88, and magnetic cap layer 92. Magnetic sensor 98 includes pinning layer 76, pinned layer 78, coupling layer 80, reference layer 82, barrier layer 84, first free layer 86, and second free layer 88. Sensor stack 96 may be formed by depositing successive layers on first shield layer 72 or may be formed in a separate process and later incorporated between first shield layer 72 and second shield layer 94.

The operation of magnetic sensor assembly 70 is substantially similar to the operation of magnetic sensor assembly 10 as described with regard to FIG. 1. In this embodiment, seed layer 74 is made of a nonmagnetic material (e.g., Ru or Cu), cap layer 90 is made of a nonmagnetic material, and cap layer 92 is made of a magnetic material. The magnetic material selected for cap layer 92 may have some or all of the properties described above with regard to cap layer 62. Seed layer 74 comprised of a nonmagnetic material, which decouples pinning layer 76 from first shield layer 72, can be made very thin to minimize the contribution to the shield-to-shield spacing. Consequently, the physical shield-to-shield spacing $ss_p$ of magnetic sensor 70 is reduced compared to similar devices including a seed layer made of conventional materials. In addition, magnetic cap layer 92 reduces the shield-to-shield spacing of magnetic sensor assembly 70 from physical shield-to-shield spacing $ss_p$ by the thickness $t_{cap}$ of magnetic cap layer 92 to an effective shield-to-shield spacing $ss_{eff}$. In some embodiments, magnetic cap layer 92 each has a thickness $t_{cap}$ between about 10 Å and about 1,000 Å.

Figure 5:
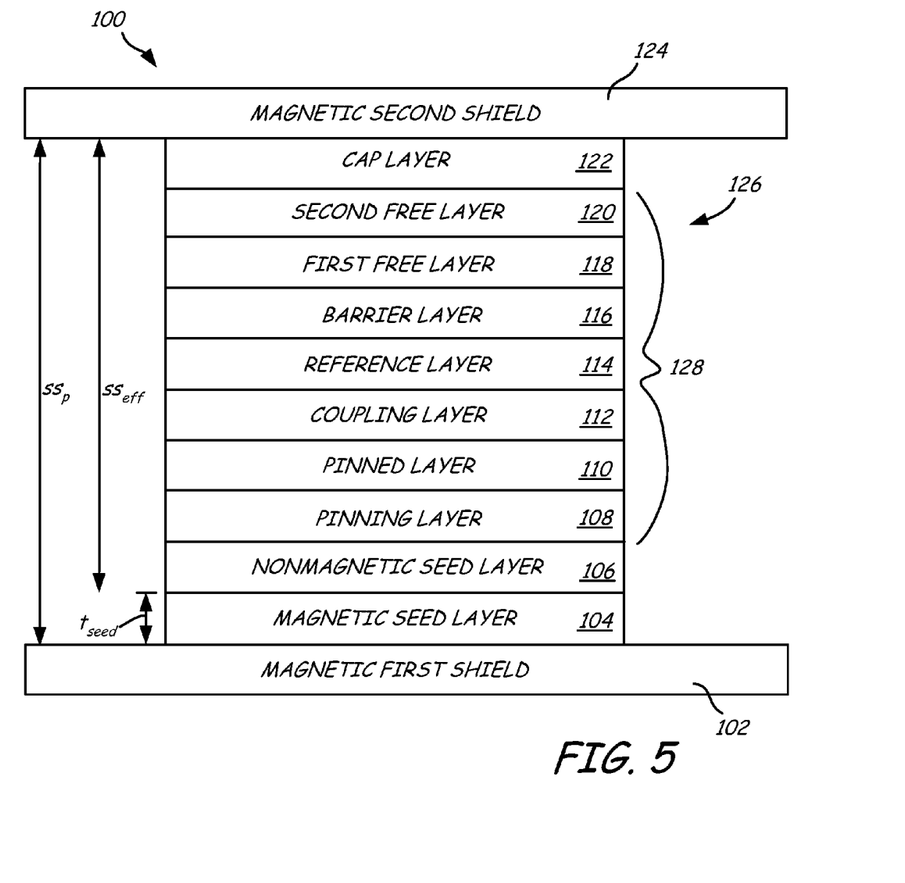
FIG. 5 is a layer diagram of a magnetic sensor assembly including magnetic first shield layer, a magnetic/nonmagnetic seed bilayer, and a magnetic second shield layer.

FIG. 5 is a layer diagram of magnetic sensor assembly 100 including first shield layer 102, first seed layer 104, second seed layer 106, pinning layer 108, pinned layer 110, coupling layer 112, reference layer 114, barrier layer 116, first free layer 118, second free layer 120, cap layer 122, and second shield layer 124. First shield layer 102 and second shield layer 124 are made of a magnetic material, such as NiFe, NiFeCu, or NiCoFe. Sensor stack 126 includes first seed layer 104, second seed layer 106, pinning layer 108, pinned layer 110, coupling layer 112, reference layer 114, barrier layer 116, first free layer 118, second free layer 120, and cap layer 122. Magnetic sensor 128 includes pinning layer 108, pinned layer 110, coupling layer 112, reference layer 114, barrier layer 116, first free layer 118, and second free layer 120. Sensor stack 126 may be formed by depositing successive layers on first shield layer 102 or may be formed in a separate process and later incorporated between first shield layer 102 and second shield layer 124.

The operation of magnetic sensor assembly 100 is substantially similar to the operation of magnetic sensor assembly 10 as described with regard to FIG. 1. In this embodiment, the seed assembly is a bilayer structure including first seed layer 104 made of a magnetic material and second seed layer 106 made of a nonmagnetic material. The magnetic material selected for first seed layer 104 may have some or all of the properties described above with regard to seed layer 14 or 44. Second seed layer 106 is comprised of a nonmagnetic material, such as Ru or Cu, to decouple pinning layer 108 from first shield layer 102. Second seed layer 106 is very thin to minimize its contribution to the shield-to-shield spacing of magnetic sensor 100, while maximizing the blocking temperature or magnetic sensor 100 and the pinning field from pinning layer 108. Consequently, the physical shield-to-shield spacing $ss_p$ of magnetic sensor 100 is reduced. In addition, when first seed layer 104 is made of a magnetic material, the shield-to-shield spacing of magnetic sensor assembly 100 is reduced from physical shield-to-shield spacing $ss_p$ by the thickness $t_{seed}$ of first seed layer 104 to an effective shield-to-shield spacing $ss_{eff}$. In some embodiments, first seed layer 104 each has a thickness $t_{seed}$ between about 10 Å and about 1,000 Å. In an alternative embodiment, cap layer 122 is also made of a magnetic material.

In an exemplary embodiment of magnetic sensor assembly 100, first seed layer 104 is made of CoZrTa (CZT) and second seed layer 106 is made of Ru. CZT is an amorphous magnetic material with magnetization that can be matched to the adjacent magnetic first shield layer 102. The Ru of second seed layer 106 may be as thin as 15 Å and still provide proper texture to grow subsequent layers of magnetic sensor assembly 100. In some embodiments, the Ta and Zr of the CZT first seed layer 104 may each have atomic percentages in the range of about 2% to about 10%.

The magnetoresistive ratio ($\Delta R/R$) in a magnetic sensor assembly 100 including a CZT/Ru bilayer is substantially similar to a corresponding magnetic sensor assembly including a conventional Ta/Ru seed assembly. In addition, the blocking temperature of magnetic sensor assembly 100 including a CZT/Ru bilayer is 275° C., compared to a blocking temperature of 270° C. for a Ta/Ru seed assembly. Furthermore, the pinning field of magnetic sensor assembly 100 including a CZT/Ru bilayer is greater than a corresponding magnetic sensor assembly including a Ta/Ru seed assembly, as shown in the following table.

| Seed Layer | Pinning Field (Oe) |
| --- | --- |
| Ta (30 Å)/Ru (30 Å) | 624.5 |
| Ta (30 Å)/Ru (15 Å) | 603.0 |
| CoZrTa (30 Å)/Ru (30 Å) | 652.5 |
| CoZrTa (30 Å)/Ru (15 Å) | 635.9 |

Consequently, magnetic sensor 100 including a CZT/Ru seed assembly provides substantially similar or superior performance to a conventional Ta/Ru seed assembly while reducing the effective shield-to-shield spacing $ss_{eff}$ by the thickness of the CZT layer.

In summary, the present invention relates to a magnetic sensor including first and second shields each comprised of a magnetic material. The first and second shields define a physical shield-to-shield spacing. A sensor stack is disposed between the first and second shields and includes a seed layer adjacent the first shield, a cap layer adjacent the second shield, and a magnetic sensor between the seed layer and the cap layer. At least a portion of the seed layer and/or the cap layer comprises a magnetic material to provide an effective shield-to-shield spacing of the magnetic sensor assembly that is less than the physical shield-to-shield spacing. By reducing the shield-to-shield spacing of the magnetic sensor, the linear density of the magnetic sensor is increased. This allows for reading of higher density media and improves shielding of the magnetic sensor from flux from adjacent bits. In addition, a magnetic seed layer of sufficient thickness results in a large pinning field, thereby improving the magnetic stability of the device.

Although the present invention has been described with reference to preferred embodiments, workers skilled in the art will recognize that changes may be made in form and detail without departing from the spirit and scope of the invention. For example, while the magnetic sensors according to the present invention have been described in the context of magnetic recording head applications, it will be appreciated that the magnetic sensors may be used in a variety of other applications, including magnetic random access memory applications.

The invention claimed is:

1. A magnetic sensor assembly comprising:
   first and second shields comprising a magnetic material, wherein a distance between the first and second shields defines a physical shield-to-shield spacing; and
   a sensor stack positioned between the first and second shields, the sensor stack including a first seed layer, first cap layer, and magnetic sensor; wherein the first seed layer and first cap layer comprise a magnetic material such that an effective shield-to-shield spacing of the magnetic sensor assembly does not include the first seed layer and first cap layer.

2. The magnetic sensor assembly of claim 1, wherein the first seed layer comprises a material selected from the group consisting of NiFeNb, NiFeTa, NiFeRh, CoZrTa, CoZrNb, CoZrNd, CoFeB, CoFeTa, CoFeZr, CoFeRh, CoFe, CoCr, or $Ni_{>70\%}Cr_{<30\%}$.

3. The magnetic sensor assembly of claim 1, wherein a crystalline structure of the first seed layer matches a crystalline structure of the first shield.

4. The magnetic sensor assembly of claim 1, wherein a crystalline structure of the first cap layer matches a crystalline structure of the second shield.

5. The magnetic sensor assembly of claim 1, wherein the first seed layer comprises an amorphous material.

6. The magnetic sensor assembly of claim 1, wherein the first seed layer has a thickness between about 10 Å and 1,000 Å.

7. The magnetic sensor assembly of claim 6, wherein the first seed layer is 50 Å thick.

8. The magnetic sensor assembly of claim 1, further comprising:
   a nonmagnetic second seed layer adjacent the first seed layer.

9. The magnetic sensor assembly of claim 8, wherein the second seed layer comprises either Ru or Cu.

10. The magnetic sensor assembly of claim 9, wherein the first seed layer comprises CoZrTa.

11. The magnetic sensor assembly of claim 10, wherein the first seed layer is 30 Å thick and the second seed layer is 30 Å thick.

12. The magnetic sensor assembly of claim 1, further comprising:
    a nonmagnetic second cap layer adjacent the first cap layer.

13. The magnetic sensor assembly of claim 12, wherein the second cap layer comprises Ta.

14. The magnetic sensor assembly of claim 13, wherein the first cap layer comprises a material selected from the group consisting of NiFeNb, NiFeTa, NiFeRh, CoZrTa, CoZrNb, CoZrNd, CoFeB, CoFeTa, CoFeZr, CoFeRh, CoFe, CoCr, or $Ni_{>70\%}Cr_{<30\%}$.

15. A magnetic sensor assembly comprising:
    first and second shields comprising a magnetic material, wherein a distance between the first and second shields defines a physical shield-to-shield spacing; and
    a sensor stack positioned between the first and second shields, the sensor stack including a first seed layer comprising an amorphous material, first cap layer, and magnetic sensor; wherein the first seed layer and first cap layer comprise a magnetic material such that an effective shield-to-shield spacing of the magnetic sensor assembly does not include the first seed layer and first cap layer.

16. A magnetic sensor assembly comprising:
    first and second shields comprising a magnetic material, wherein a distance between the first and second shields defines a physical shield-to-shield spacing; and
    a sensor stack positioned between the first and second shields, the sensor stack including a first seed layer, first cap layer, and magnetic sensor; wherein the first seed layer and first cap layer comprise a magnetic material such that an effective shield-to-shield spacing of the magnetic sensor assembly does not include the first seed layer and first cap layer, and wherein a crystalline structure of the first cap layer matches a crystalline structure of the second shield.

* * * * *